United States Patent [19]

Boudry

[11] 3,742,260

[45] June 26, 1973

[54] M. O. S. TRANSISTOR CIRCUITS FOR PULSE-SHAPING

[75] Inventor: Jean-Marie Boudry, Paris, France

[73] Assignee: SESCOSEM-Societe Europeenne de Semiconducterus et de Microelectronique

[22] Filed: May 6, 1971

[21] Appl. No.: 140,738

[30] Foreign Application Priority Data

May 13, 1970 France .............................. 7017417

[52] U.S. Cl. ................. 307/304, 307/251, 307/246, 321/15

[51] Int. Cl. ........................................... H03k 17/60

[58] Field of Search ....................... 321/15; 307/205, 307/251, 279, 304, 246; 330/38 R

[56] References Cited

UNITED STATES PATENTS

| | | | |
|---|---|---|---|
| 2,772,371 | 11/1956 | Denton | 321/15 X |
| 3,095,533 | 6/1963 | Keizer | 321/15 X |
| 3,286,189 | 11/1966 | Mitchell et al. | 330/38 R |
| 3,392,341 | 7/1968 | Burns | 307/304 X |
| 3,473,043 | 10/1969 | James | 307/304 X |

*Primary Examiner*—John S. Heyman
*Attorney*—Cushman, Darby & Cushman

[57] ABSTRACT

A voltage doubler comprises an input terminal to which is applied a square wave voltage, taking a positive voltage value during recurrent time intervals of fixed duration and the zero value, during recurrent time intervals of fixed duration. Two resistance capacitance circuits are connected to this terminal. The first circuit comprises a first resistor and first capacitor series connected between the ground and the input terminal. The second circuit comprises a resistor, a diode series connected between the input terminal and the output terminal, and a capacitor connected in series with the capacitor of the first circuit between the output terminal and the ground. The time constants of the first and second circuits are appropriately chosen.

4 Claims, 8 Drawing Figures

M. O. S. TRANSISTOR CIRCUITS FOR PULSE-SHAPING

The present invention relates to metaloxide semiconductor field effect transistors of (M.O.S.) type circuits for pulse-shaping applications, designed for example to control miniaturized electrical and electromechanical devices such as a divider circuit or a drive motor of an electronic watch through integrated circuits.

Those skilled in the art will be aware of the existence of M.O.S. transistor circuits of this kind, which are generally of integrated form and comprise a pulse-shaping stage which contains an M.O.S. input transistor, a M.O.S. load transistor and an M.O.S. clamping transistor.

These circuits have the drawback that they dissipate a relatively large amount of power upon application of triggering pulses at the input transistor. The object of the present invention is a circuit of this kind having a low power consumption, and a high power ratio.

The invention will be better understood from a consideration of the following description, and by reference to the attached drawing in which FIG. 1 illustrates diagrammatically the circuit according to the invention.

Figure 5:
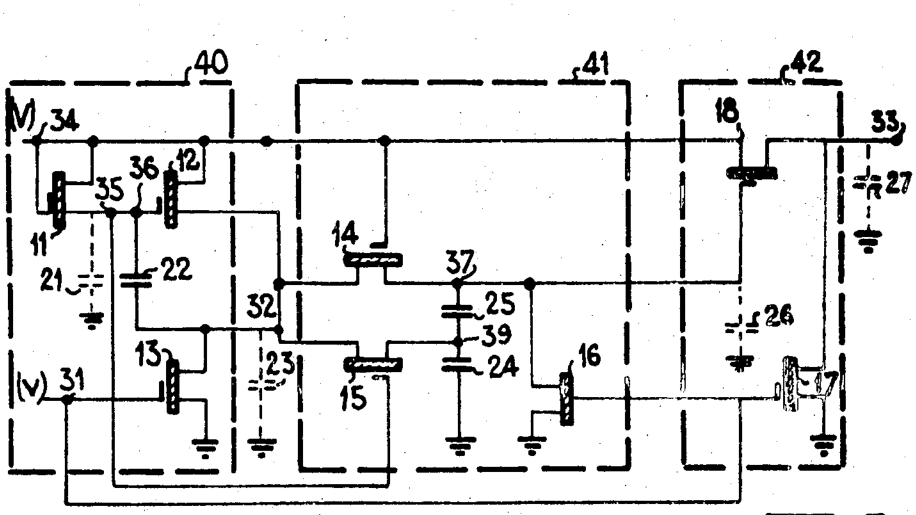
FIG. 5 is an embodiment of an integrated circuit, in which the circuit of FIG. 1 is incorporated.

This circuit comprises a terminal 32 for receiving an input signal and a terminal 37 for providing an output signal. Input terminal 32 is connected to ground through a resistor 151 having a resistance $R_1$ and a capacitor 24, series connected, the capacitor having a capacitance $C_1$.

Input terminal 32 is connected to output 37 by a resistor 141, having a resistance value $R_2$ and a diode D, said diode D being mounted in the direct sense from the input to the output.

Output terminal 37 is connected to terminal 39, of capacitor 34, which is not earthed, by means of a capacitor 25 having a capacitance value $C_2$ which is less than $C_1$.

Figure 2:
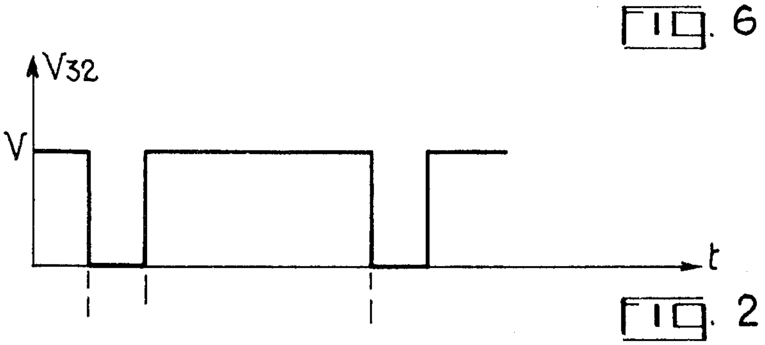
FIGS. 2, 3 and 4 are diagramms illustrating the operation of the device of FIG. 1.

The device operates as follows. A square wave signal is applied at the input terminal 32. This voltage has a positive level V, during time intervals of duration T, and a zero level during time intervals $t < T$ (FIG. 2).

Upon the first application of level V capacitors 24 and 25 are charged for capacitor 25 across resistor 141 and diodes D and for capacitor 24, across resistor 131. Time constant $R_1C_1$ being much lower than time constant $R_2C_2$, capacitor 25 is charged after a very short time interval, and a difference of potential V is applied between the two electrodes of this capacitor ; after a time interval having a long duration relatively to the charging of capacitor 25, a difference of potential V is applied between the two electrodes of capacitor 24.

Figure 3:
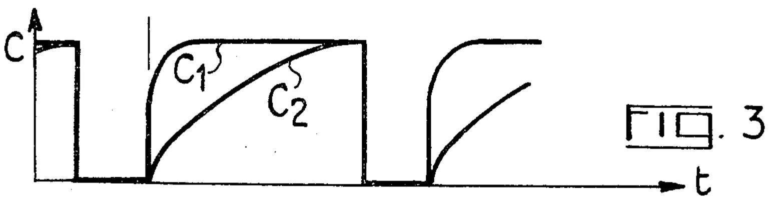

The discharge of capacitor 25 is prevented by the presence of diode D. The load curves plotted vs. time of the two capacitors are shown FIG. 3.

After the loading of capacitor 25, the difference of potential $V_{37} - V_{38}$ is equal to $V - V_{gsv}$, $V_{gsv}$ being the potential drop in the diode. The potential at the point 37 is equal to $2V - V_{gsv}$.

Figure 4:
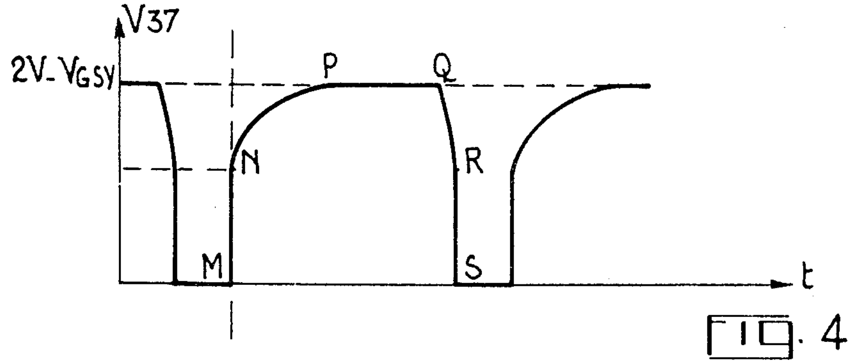

Curve of FIG. 4 shows the variation of $V_{37}$ vs time.

The diagram of $V_{37}$, in FIG. 4, illustrates a series of pulses such as those PN PQRS of width MS equivalent to that of the pulses $V_{32}$, having a plateau PQ of amplitude $2\ V - V_{gsv}$ and a complex rise function MNP. The decay function QRS is steep. This pulse is the result of the superposition of the operations of charge up and discharge of the capacitances 24 and 25.

FIG. 5 shows an application of this voltage doubler, for the embodiment of a pulse generator, having a high power ratio and a low energy consumption. This circuit can be integrated, and comprises only M.O.S. transistors and capacitors.

The figures have been drawn with M.O.S. transistors having an N-type channel. All the voltages would be of the reverse sign if P-type channel M.O.S. transistors were to be used.

Figure 1:
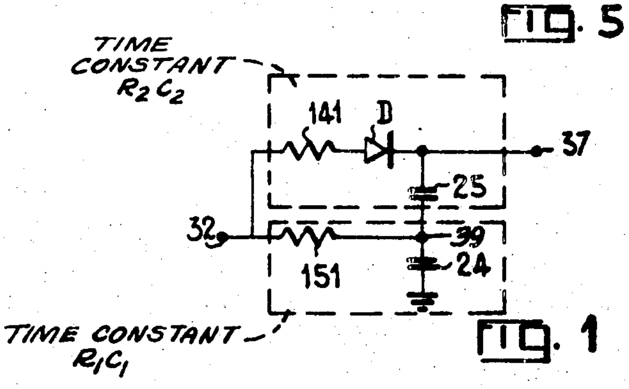
FIG. 1 shows schematically a voltage doubler according to the invention.

The circuit of FIG. 5 comprises three stages 40, 41 and 42. Stage 41 is a transistorized embodiment of the device of FIG. 1. The stage 40 comprises three transistors 11, 12 and 13 and a capacitor 22. The transistor 11 has its drain and gate connected to a terminal 34, positive terminal of a d.c. supply source of voltage V, for example 1.5 volt battery. The source of the MOS transistor 11 is connected to a terminal 36 to which there is also connected one electrode of the capacitor 22 whose other electrode is connected to an output terminal 32 of the stage 40. The gate-earth capacitance of the transistor 12 is indicated by a broken line at 21 in the figure. The transistor 12 has its drain taken to the terminal 34, its source to the terminal 32 and its gate to a terminal 36 to which there is also connected a secondary output 35. The transistor 13 has its drain connected to the input terminal 32, its source to earth and its gate connected to the input terminal 31 of the stage 40.

The stage 41 embodies three transistors 14, 15 and 16 and two capacitors 24 and 25. The transistor 14 has its gate taken to the terminal 34, its drain to the terminal 32 and it source to a terminal 37 to which there is connected one electrode of capacitor 25 whose other electrode is connected to a terminal 39 to which there is also connected an electrode of capacitor 24 whose other electrode is earthed. The transistor 15 has its gate connected to the secondary output 35, its drain to the terminal 22 and its source to the terminal 39. The transistor 16 has its gate connected to the terminal 31, its drain to the terminal 37 and its source earthed.

Figure 6:
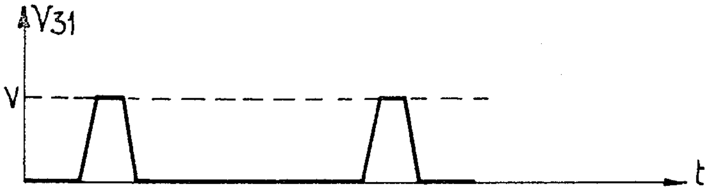
FIG. 6 is the input voltage of the circuit of FIG. 5.

The signal applied to the input 31 is a train of positive recurrent pulses FIG. 6, having a peak value V. Voltage at the point 35, when the MOS transistor 11 is in a conductive state is $V - Vgsy$ , $Vgsy$ being the threshold voltage of the MOS transistor 11, the gate and the drain of this MOS being interconnected. A pulse applied at 31, unblocks MOS transistor 13. Voltage at point 32, FIG. 2, drops to zero. This voltage is the input signal of FIG. 2. Capacitor 22 is thus charged; After disappearance of the pulse, at terminal 31, MOS transistor 13 is blocked and the potential at terminal 32 increases, and takes the value V, MOS transistor 12 being conductive. Potential at terminal 36, reaches the value $V + V - V$ gsy the capacitor remaining loaded.

In the stage 41, the resistor 141 and diode D are replaced by the MOS transistor 14, having its gate at the potential V and its drain connected at 32, and its source at 37. Resistor 151 is replaced by the MOS transistor 15.

In other terms, MOS transistor 15 is always in the conductive state, and MOS transistor 14 is blocked when potential at terminal 37 attains the value V.

Stage 41 comprises further, a MOS transistor 16 having a source earthed and drains connected to point 37, and a gate connected to MOS 17 of stage 42.

This MOS transistor allows the discharging of the capacitors at the end of the crenel. In the stage 41 $C_1$ is of the order of 10 $C_2$.

$R_1C_1>R_2C_2$, $R_1C_1$ being substantially equal to 3 or 4 $R_2C_2$.

Stage 42 is a power amplifier. It comprises two MOS transistor 16 and transistor 17. MOS 17 has its gate connected to the gate of MOS transistor 16 and its drain connected at point 33, output of the device, MOS transistor 18 has its gate connected at terminal 37, its source at potential + V, and its drain to the output terminal 33. Capacitance 27 is the load.

This circuit operates as follows.

Voltages $V_{31}$ and $V_{37}$ respectively applied at terminal 31 and 32, (FIGS. 6 and 4)are as follows : $V_{31}$ at potential V when $V_{37}$ at zero. $V_{31}$ at zero, when $V_{37}$ at V. In the second case, MOS transistor 16 and 17 are blocked, MOS 18 is conductive. Capacitor 27 is charged at 2V.

Figure 7:
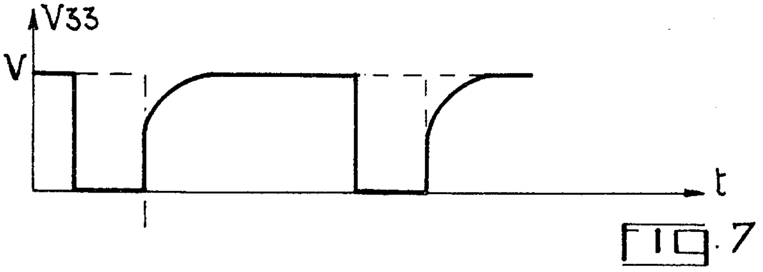
FIG. 7 is the output voltage of the circuit of FIG. 5.

In the first case, MOS transistor 18 is blocked and Capacitor 27 is discharged across MOS transistor 17. The curve of FIG. 7 is thus obtained. This device has a power consumption lower than that of stage 40 taken alone, for the same purpose, i.e. for a same load.

If the stage 40 is taken alone, its output impedance is that of MOS transistor 13, conductive. This impedance for most purposes must be low, and the power consumption is consequently high.

The use of stages 41, and 42*n* allows the use of a MOS transistor having an impedance very high, and higher than that of the load (i.e. 20 to 30 times higher).

For example, for the stage 40 taken alone for $V = 1,5$ Volt $V_{gsy} = 0,3$ Volt The resistance of MOS transistor 13 is between 1,000 and $10^6$ ohms.

The power consumption delivered by supply V, comprises the discharge of capacitance 23, load of the stage i.e. F C $V^2/2$ F being the recurrence frequency of the pulses, i.e. for a capacitance of 150 pF and $F = 8,000$ c/1, one microwatt.

This consumption also includes the power consumption in transistor 13, the power consumption in the other transistors being neglected.

This energy is $V^2/R$ i.e. 200 microwatts assuming this transistor being always in the conductive state. Assuming $t/T$ being to 1/10, the power consumption is equal to $V^2/10$ R, i.e. 20 microwatts.

For the device hereinabove described and containing the voltage doubler according to the invention, the power consumption in the capacitors is substantially the same in the stage 40 taken alone $C_{24}$, and $C_{25}$ being negligible with respect to $C_{27}$.

As concerning the power dissipated in the M.O.S. transistors it can be shown that transistor 13 can have a very high resistance i.e. 20 times higher than in the stage 40 taken alone.

In the other stages, transistors 14, 15 and 16 can have very high resistances relative to that of transistor 13.

The power consumption is of the order of 1 microwatt.

As a consequence,the power consumption of the device shown in FIG. 5 is low with respect to that of the stage 40 taken alone, the load being the same.

Summarizing then the overall consumption figures are respectively 21 microwatts in the case of the stage 40 on its own, and 2 microwatts in the case of the circuit of FIG. 5.

The circuit described hereinbefore is applicable to the control of a divider circuit in an electronic watch, using the values quoted here by way of example and the divider circuit being connected between the input terminal 34 and earth.

Figure 8:
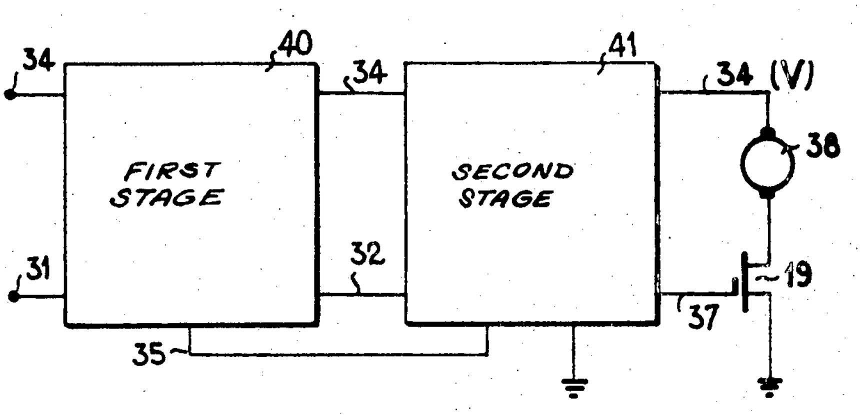
FIG. 8 is a diagramm showing the application of the circuit of FIG. 5 for controlling a motor.

It is possible to utilize a circuit which exhibits the characteristics of the invention, in order to control the drive motor of an electronic watch, by employing the circuit shown in FIG. 8 where it is assumed that all the transistors are of the M.O.S. type with N-type channels.

A stepping motor 38 is connected in series between the terminal 34 of the circuit and the drain of an M.O.S. control transistor 19 whose source is earthed. The gate of the transistor 19 is connected to the terminal 37 of the stage 41.

On arrival of a triggering pulse, once per second for example, the voltage $V_{37}$ assumes the value 2 V $- V_{GSY}$, the transistor 19 goes conductive and the motor executes one step.

The advantage of the circuit in accordance with invention in this latter case, arises from the boost in the triggering voltage of the transistor 19. In other words, it is well known that the resistance of a conductive M.O.S. transistor is inversely proportional to the gate control voltage. However, this resistance being in series with the motor 38, it is obviously desirable to reduce it as far as possible. From the foregoing mode of operation, the result is that $V_{37}$ is substantially double the supply voltage V. The resistance of the conductive transistor 19 will therefore be substantially half that which would be obtained if the motor 38 and the transistor 19 were connected to the output of the stage 40. In addition, by introducing between the terminal 37 and earth a capacitance in the order of 5 pF for example (the M.O.S. transistor 19 having to be large), makes it necessary to increase the capacitances of the capacitors 24 and 25 but,because of the frequency, the resistance of the conductive transistor 12 can be maintained.Consequently, a leakage current of the same order as that occurring in the case of control of a divider circuit, is obtained. It will be appreciated that this power consumption is negligible by reason of the fact that it only takes place about once per second instead of 8,000 times per second as in the foregoing application.

Self-evidently, the invention is not limited to the embodiments described and illustrated here by way of example.

What I claim is:

1. A voltage doubler comprising in combination:

one input and one output terminal, a first circuit comprising a first resistance means and a first capacitor, series connected for connecting said input terminal to the ground, said first circuit having a first time constant, and said first capacitor having a grounded electrode, and another electrode, a second circuit comprising a second resistance means and rectifying means series connected for conducting a current flowing from said input terminal to said output terminal and a second capacitor directly connecting said output terminal to said another electrode, said second circuit having a second time constant substantially higher than said first time constant, and means for applying at said input terminal, a square wave voltage having a predetermined recurrence frequency and taking a positive level, during first time intervals having a duration substantially greater than said second time constant.

2. A voltage doubler as claimed in claim 1, wherein said first resistance means comprise a first MOS transistor, having its source connected to said input terminal, its drain connected to said first capacitor, and a gate, said second resistance means and said rectifying means comprising a second MOS transistor having a gate connected to a D.C. supply, supplying a constant voltage, a source connected to said input terminal and a drain to said output terminal, a third MOS transistor having its source grounded, its drain connected to the drain of said second transistor.

3. A voltage doubler as claimed in claim 2, wherein said voltage applying means comprise a fourth MOS transistor having a gate for receiving a recurrent train of positive polarity pulses, having said recurrent frequency, a source grounded, and a drain connected to said input terminal, and means for receiving said pulses, and for generating in response, said square wave voltage.

4. A voltage doubler as claimed in claim 3, wherein said pulse receiving means comprise a fifth transistor, having its gate and source connected to said D.C. voltage source, its drain to the gate of said first transistor, and a third capacitor for connecting said last mentioned drain to said input terminal, and a sixth transistor, having a source connected to said D.C. voltage source, a drain to said input terminal, and a drain connected to drain of said fifth transistor.

* * * * *